United States Patent [19]

Kakizaki et al.

[11] Patent Number: 5,387,265
[45] Date of Patent: Feb. 7, 1995

[54] SEMICONDUCTOR WAFER REACTION FURNACE WITH WAFER TRANSFER MEANS

[75] Inventors: Satoshi Kakizaki; Toshikazu Karino; Shoichiro Izumi; Mikio Koizumi; Makoto Ozawa; Fumihide Ikeda; Tohru Yoshida; Ryoji Saito, all of Tokyo, Japan

[73] Assignee: Kokusai Electric Co., Ltd., Tokyo, Japan

[21] Appl. No.: 966,721

[22] Filed: Oct. 26, 1992

[30] Foreign Application Priority Data

Oct. 29, 1991 [JP] Japan .................................. 3-309794

[51] Int. Cl.⁶ ........................ H01L 21/68; C23C 16/00
[52] U.S. Cl. .............................. 29/25.01; 437/248; 118/725; 118/730
[58] Field of Search ............. 29/25.01; 118/719, 715, 118/725, 730; 437/248; 414/DIG. 4, DIG. 5

[56] References Cited

U.S. PATENT DOCUMENTS

| | | | |
|---|---|---|---|
| 4,178,113 | 12/1979 | Beaver, II et al. | 406/10 |
| 4,223,450 | 9/1980 | Rothchild | 34/16 |
| 4,425,210 | 1/1984 | Fazlin | 204/192 E |
| 4,770,590 | 9/1988 | Hugues et al. | 414/172 |
| 4,775,281 | 10/1988 | Prentakis | 414/416 |
| 4,962,726 | 10/1990 | Matsushita et al. | 118/719 |
| 5,100,276 | 3/1992 | Iwasaki et al. | 414/222 |
| 5,215,420 | 6/1993 | Hughes et al. | 414/217 |
| 5,217,340 | 6/1993 | Harada et al. | 414/172 |

*Primary Examiner*—Olik Chaudhuri
*Assistant Examiner*—David E. Graybill
*Attorney, Agent, or Firm*—Graham & James

[57] ABSTRACT

In the semiconductor manufacturing apparatus according to the present invention, there are provided a cassette stocker for accommodating wafer cassettes loaded with wafers, a reaction furnace provided with heating means, a reaction gas introducing means for introducing reaction gas into the reaction furnace, a gas discharging means for discharging exhaust gas in the reaction furnace, a boat for supporting wafers, a buffer cassette stocker for storing unprocessed wafers, a boat elevating means for inserting the boat into and retrieving the boat from the reaction furnace, a wafer transfer means for transferring wafers between the boat and the wafer cassette accommodated on the cassette stocker, and a wafer cassette transfer means for transferring wafer cassettes between the buffer cassette stocker and the cassette stocker, and the buffer cassette stocker is enclosed to provide an antioxidation area to prevent natural oxidation of the wafers in standby status.

14 Claims, 14 Drawing Sheets

SEMICONDUCTOR WAFER REACTION FURNACE WITH WAFER TRANSFER MEANS

BACKGROUND OF THE INVENTION

The present invention relates to a semiconductor manufacturing apparatus for manufacturing semiconductor elements such as Integrated Circuits (ICs) from wafers such as silicon wafers.

One of the processes for manufacturing semiconductor elements such as ICs is a chemical vapor deposition (hereinafter abbreviated as "CVD") process, or diffusion process, for producing various types of thin films on the surface of silicon wafers.

A conventional semiconductor manufacturing apparatus is described in the following, using a vertical CVD apparatus having a vertical furnace as an example.

To handle and transport wafers, a predetermined number (e.g. 25 pcs.) of wafers are generally loaded and transported by a wafer cassette. A conventional semiconductor manufacturing apparatus is provided with a cassette stocker, which accommodates in turn the wafer cassettes for one batch of wafers. The wafers are removed from the wafer cassettes for processing.

The following describes a conventional vertical CVD apparatus with reference to FIG. 14.

In a cubicle 1, a reaction furnace 2 is provided, and a boat elevator 3 is furnished under the reaction furnace 2. A wafer transfer system 4 is placed parallel to the boat elevator 3, and a cassette stocker 5 is provided near the wafer transfer system 4.

The boat elevator 3 inserts and retrieves the boat 6 loaded with horizontally stacked wafers into and out of the reaction furnace 2. The boat 6 is placed in a boat receiver (not shown), which is supported by a guide rod 7. Further, the boat receiver is connected to a screw rod 8 and a motor (not shown) so that the boat 6 is moved up and down through rotation of the screw rod 8 by the motor.

The cassette stocker 5 delivers and receives the wafer cassettes 10 used to load or store wafers 9. In the present example, the cassette stocker 5 can accommodate wafer cassettes in two columns having five shelves, and the cassette stocker 5 can be moved horizontally with respect to the columns of the cassette stocker 5.

The wafer transfer system 4 comprises a lifting block 12 supported by a guide rod 11; a screw rod 14 which is rotated by a motor 13 and engaged with the lifting block 12 by a screw; and a wafer handling head 15 mounted on the lifting block 12. By moving the wafer handling head 15 and the associated lifting block 12 up and down, the wafer transfer system 4 transfers wafers 9 from the wafer cassette 10 situated in the cassette stocker 5 to the boat 6 or transfers wafers 9 from the boat 6 to the wafer cassette 10 situated in the cassette stocker 5.

The following describes the flow of wafer processing, referring to FIG. 15.

The wafer cassette 10 containing wafers 9 is moved and stored in a box which is filled with antioxidant gas while awaiting film forming processing. The wafer cassette 10 is taken out of the box when film processing is to begin. When taken out, the wafer cassette 10 is automatically or manually moved into the vertical CVD apparatus and situated in the cassette stocker 5.

The wafers 9 of the wafer cassette 10 situated in the cassette stocker 5 are transferred to the boat 6 by the wafer transfer system 4. When a predetermined number of the wafers 9 have been transferred to the boat 6, the boat elevator 3 places the boat 6 into the reaction furnace 2.

The interior of the reaction furnace 2 is heated to a preset temperature by heating means 20. The air in the furnace is discharged by a discharging means 18. Further, reaction gas 16 for forming film is introduced into the furnace by a reaction gas introducing means 17.

The reaction gas is introduced at a ratio of preset quantity into the reaction furnace 2 during the processing of the wafers 9 and the gas is discharged by the discharging means 18 after processing.

The reaction gas introduced into the reaction furnace 2 reacts and decomposes due to heat in the furnace. The reaction gas is then deposited on the surface of the wafers 9, and thin film as desired is formed.

When the film has completely formed, the boat 6 is removed by the boat elevator 3, and the wafer transfer system 4 transfers the wafers 9 from the boat 6 to an empty wafer cassette 10 on the cassette stocker 5.

Then, the same procedure is repeated, and films are formed sequentially on each of the wafers 9 in each of the wafer cassettes 10 which are accommodated in the cassette stocker 10. The wafer cassette 10 containing the processed wafers is then removed from the cubicle 1 after processing has been completed.

As described above, a conventional semiconductor manufacturing apparatus is provided with only one set of cassette stockers and can accommodate the wafer cassettes for only one batch of wafers. As a result, the wafer cassettes must be removed from the semiconductor manufacturing apparatus as soon as the processing of the wafers has been completed in order to empty the cassette stocker and subsequently move the next batch of wafer cassettes into the cassette stocker. Accordingly, wafer processing by the reaction furnace must cease while the wafer cassettes loaded with the processed wafers are replaced by the wafer cassettes loaded with the unprocessed wafers.

By the present invention, it is possible to increase wafer processing efficiency because the processing of wafers is not stopped even when the wafer cassettes, loaded with the processed wafers, are being replaced by the wafer cassettes loaded with the unprocessed wafers.

Further, natural oxidation of the wafers during the manufacturing process may negatively impact the quality of the product. The present invention can prevent the undesirable natural oxidation of wafers during the manufacturing process.

DETAILED DESCRIPTION OF THE PREFERRED EMBODIMENTS

Figure 1:
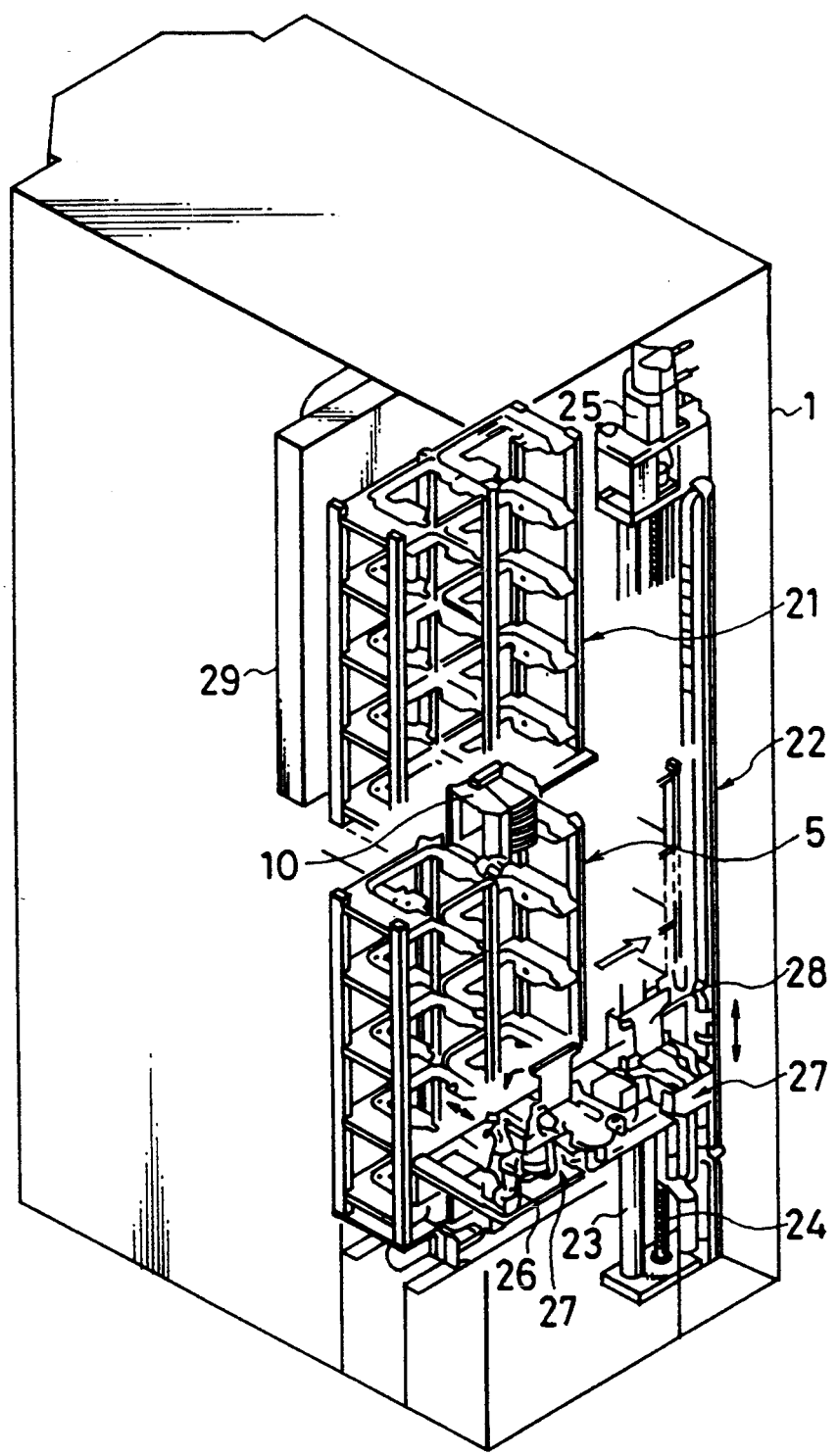
FIG. 1 is a perspective view of a first embodiment of the present invention as seen from left above.
Figure 2:
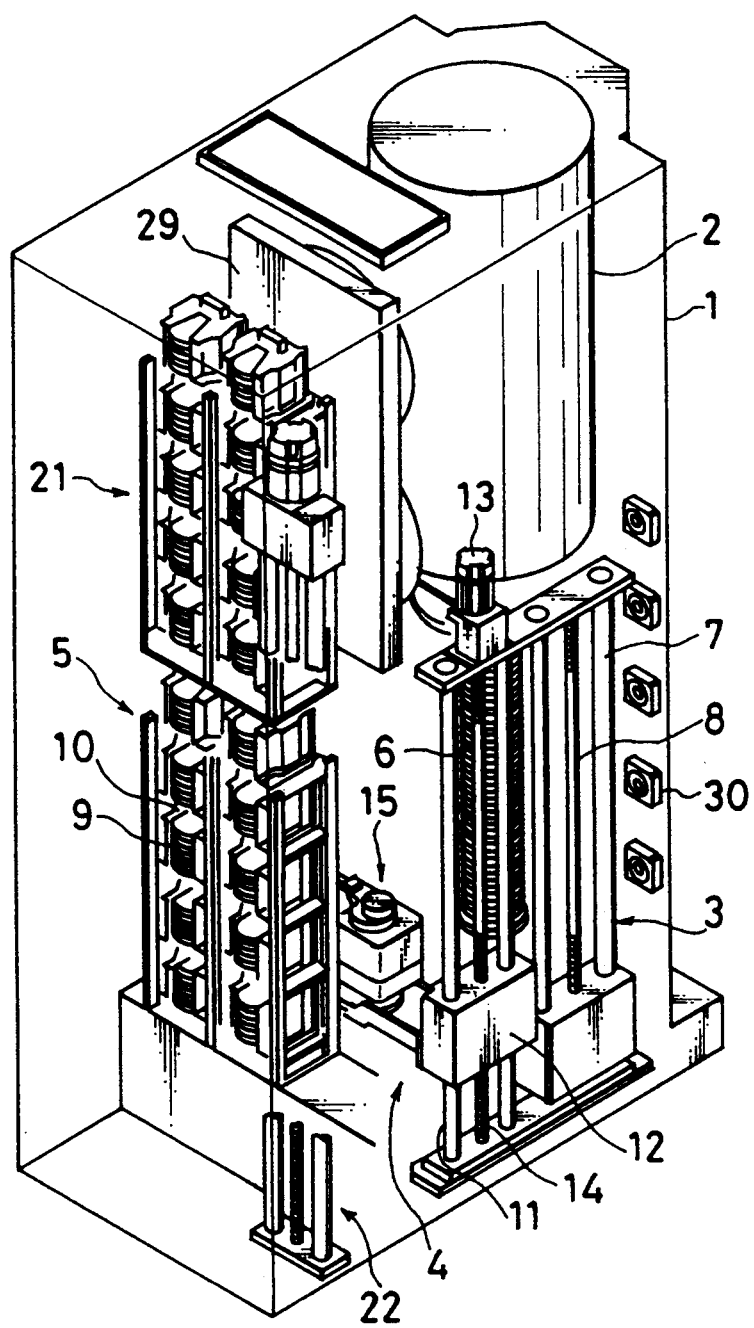
FIG. 2 is a perspective view of the first embodiment of the present invention as seen from right above.

The following is a description of a first embodiment of the present invention according to FIG. 1 and FIG. 2.

Figure 14:
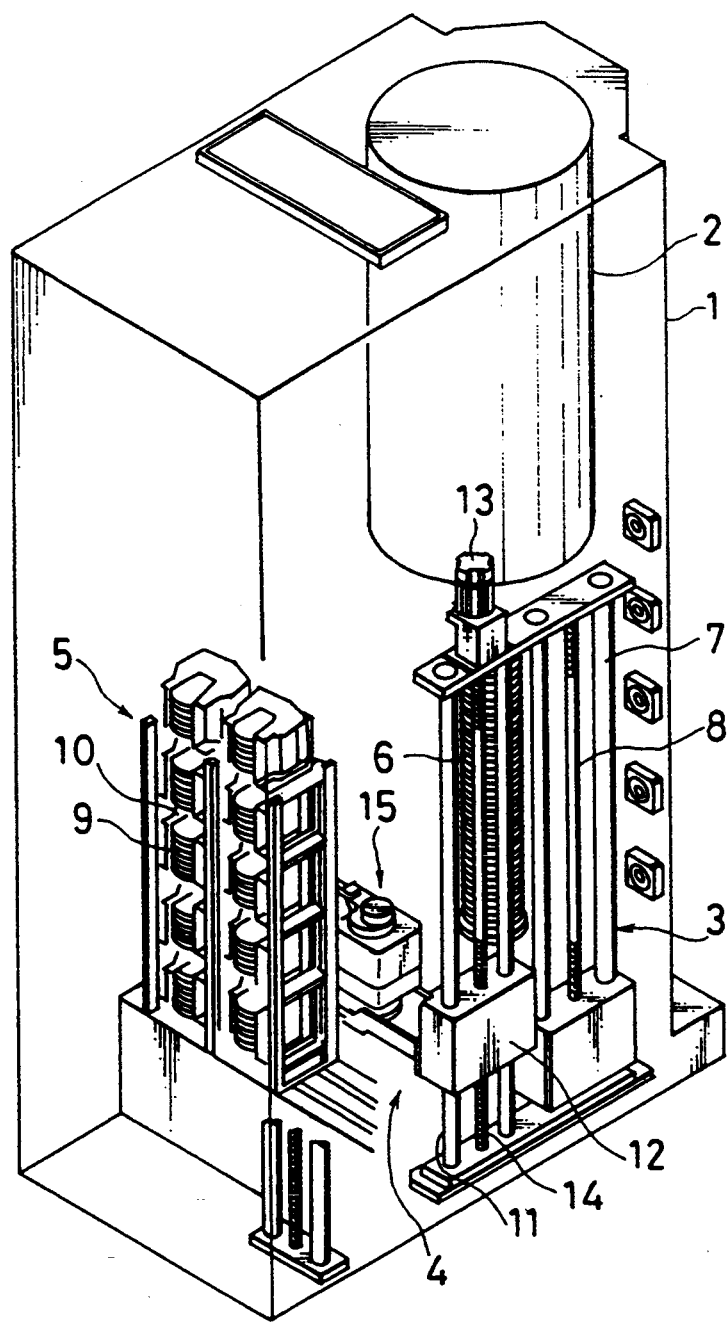
FIG. 14 is a perspective view of a conventional apparatus.
Figure 15:
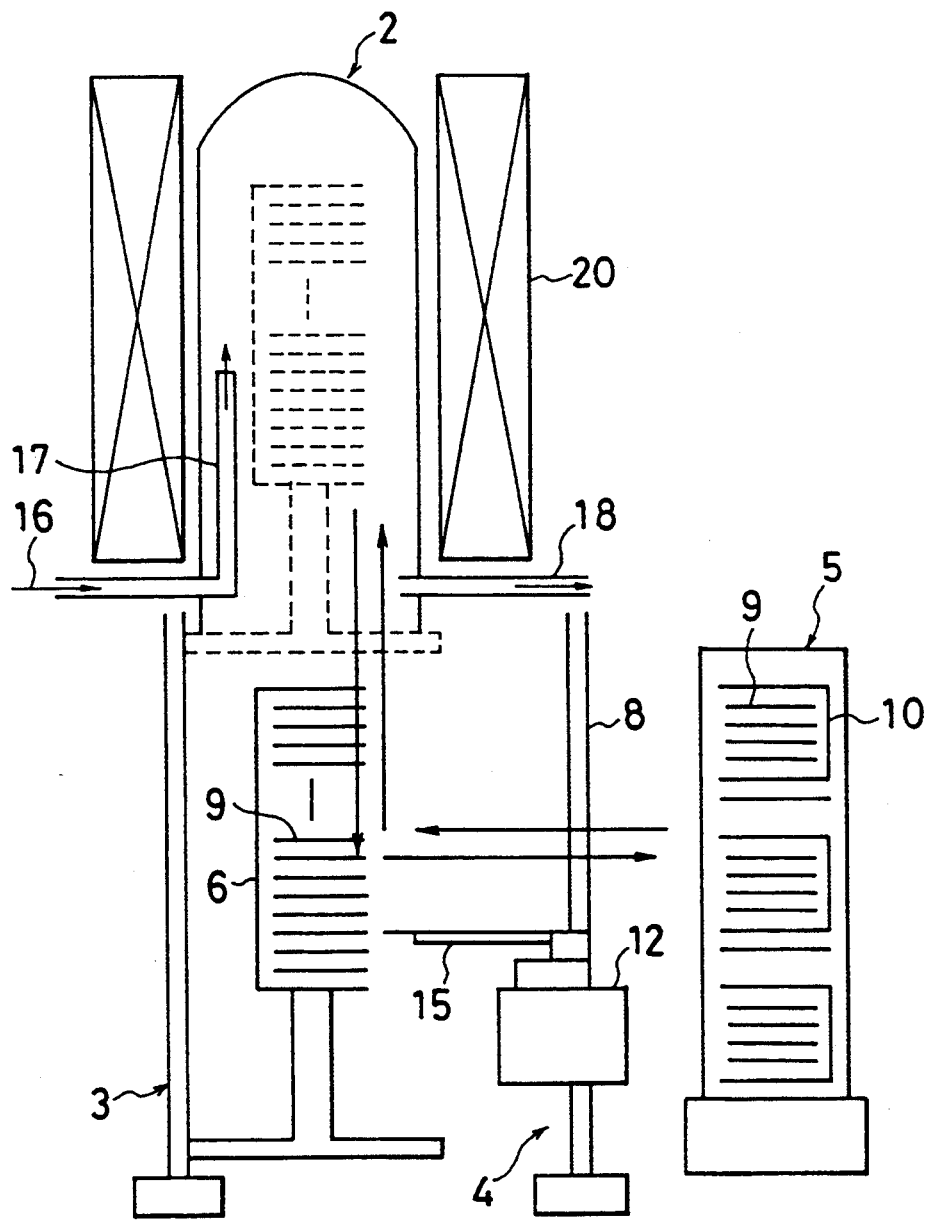
FIG. 15 is a drawing describing the operation of the conventional apparatus.

FIG. 2 is comprised of many of the same components and described by the same reference numerals as used in FIG. 14. Therefore, the detailed description is not repeated.

In the present embodiment, there are provided a reaction furnace 2, a boat elevator 3, a wafer transfer system 4, and a cassette stocker 5 which are similar to the conventional apparatus. Additionally, there are provided a buffer cassette stocker 21 located above the cassette stocker 5 and a wafer cassette receiving system 22 adjacent to both the buffer cassette stocker 21 and the cassette stocker 5. The wafer cassette receiving system 22 extends vertically to service both the cassette stocker and the buffer cassette stocker.

The buffer cassette stocker 21 has a construction similar to that of the cassette stocker 5. Wafer cassettes loaded with the next batch of unprocessed wafers (hereinafter, a wafer cassette loaded with wafers to be processed is referred to as an "unprocessed wafer cassette") may be placed into the buffer cassette stocker 21.

A clean unit 29 is provided between the buffer cassette stocker 21 and the reaction furnace 2. In FIG. 2 the reference numeral 30 represents an exhaust fan.

The wafer cassette receiving system 22 receives an unprocessed wafer cassette 10 transported from outside the semiconductor manufacturing apparatus and transfers the unprocessed wafer cassette 10 into the cassette stocker 5 or the buffer cassette stocker 21. Further, it transfers the unprocessed wafer cassette 10 from the buffer cassette stocker 21 to the cassette stocker 5.

Next, a detailed description is provided which describes the wafer cassette receiving system 22.

The cassette stocker 5 and the buffer cassette stocker 21 are located on the inner front portion of the vertical CVD apparatus.

Two vertical guide rods 23 are positioned on the same side of the cassette stocker 5 and the buffer cassette stocker 21, run parallel to them and extend the vertical distance required to service both the cassette stocker 5 and the buffer cassette stocker 21. Between the two guide rods 23, a screw rod 24 is rotatably arranged and is connected to an elevator motor 25, which is mounted on the top of the screw rod 24.

A lifting base 26 is arranged in front of the cassette stocker 5 and the buffer cassette stocker 21. The lifting base 26 is slidably mounted on the guide rods 23 and is connected to the screw rod 24.

On the lifting base 26, two sets of wafer cassette handling units 27 are arranged to match each row of wafer cassettes in the cassette stocker 5 and the buffer cassette stocker 21.

Each of the cassette handling units 27 is provided with an L-shaped wafer cassette receiver 28, which is rotatable around a horizontal rotating shaft by 90° and is supported by a link device so that it can be moved back and forth with respect to the buffer cassette stocker 21.

The buffer cassette stocker 21 is designed in the same manner as the cassette stocker 5, however, it may have a different design from that of the cassette stocker 5.

Figure 3:
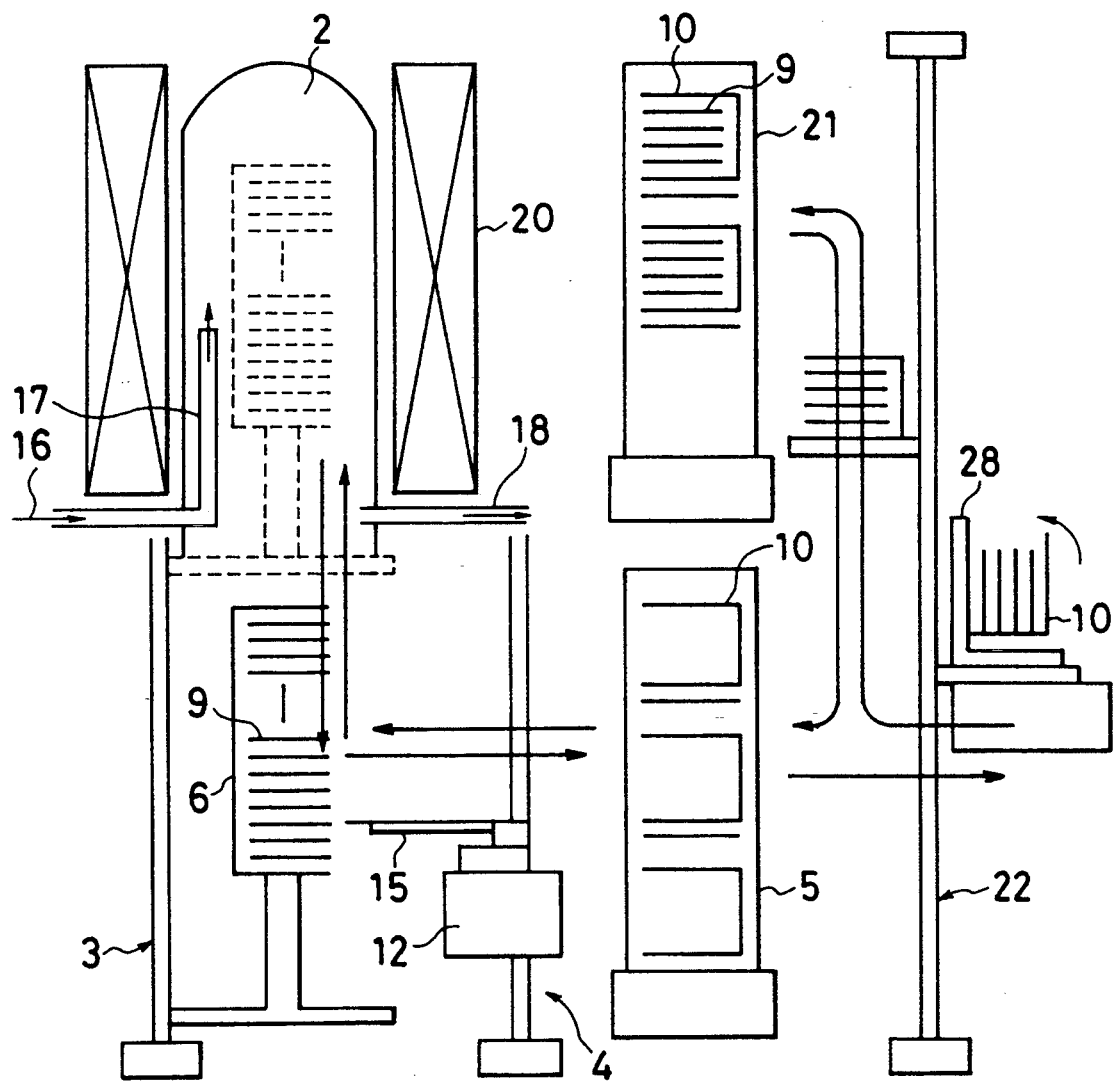
FIG. 3 is a drawing describing the operation of the first embodiment of the present invention.

Next, the operation of the first embodiment of the present invention will be described in connection with FIG. 3.

The following description assumes that the above operation is started when the cassette stocker 5 and the buffer cassette stocker 21 are in an empty condition.

The lifting motor 25 drives the cassette handling unit 27 downward through the lifting base 26, and the cassette handling unit 27 is set in standby condition at the uppermost shelf of the cassette stocker 5.

The wafer cassette 10 loaded with unprocessed wafers 9 is placed on the cassette receiver 28 in the cassette handling unit 27 either by a carrier or by an operator. The unprocessed wafer cassette 10 on the cassette receiver 28 is held in vertical position to prevent the loaded wafers from falling out of the cassette. Next, the cassette receiver 28 is rotated at an angle smaller than 90° to prevent the wafers 9 from being dislodged.

The cassette receiver 28 advances into the cassette stocker 5 and is additionally rotated so that the rotating angle of the cassette receiver 28 is 90°. Further, when the lifting base 26 is moved slightly down by the cassette stocker 5, the unprocessed wafer cassette 10 is transferred to a shelf of the cassette stocker 5. Once the cassette receiver 28 is moved backward, the step of accommodating the unprocessed wafer cassette 10 onto the uppermost shelf of the cassette stocker 5 is completed.

The lifting motor 25 then drives the cassette handling unit 27 downward toward a second shelf of the cassette stocker 5. Thus, the cassette handling unit is prepared to start the process of moving the next wafer cassette 10 onto the second shelf.

The process of loading wafer cassettes 10 is performed repeatedly to each of the desired locations on the cassette stocker 5 and the buffer cassette stocker 21. Empty locations may be left at either the cassette stocker 5 or the buffer cassette stocker 21, depending on the program of the operation.

Once the unprocessed wafer cassettes 10 have been accommodated into the cassette stocker 5 and the buffer cassette stocker 21, the wafer transfer system 4 begins transferring the wafers 9 from the cassette stocker 5 to the boat 6.

When a desired number of wafers 9 have been transferred to the boat 6, the boat elevator 3 inserts the boat 6 into the reaction furnace 2. The empty wafer cassette 10 remains in the cassette stocker 5.

When film forming of the wafers 9 in the reaction furnace 2 has been completed, the boat 6 is retracted by the boat elevator 3. The wafer transfer system 4 then transfers the wafers 9 from the boat 6 to the empty wafer cassette 10 situated in the cassette stocker.

When all the processed wafers 9 have been transferred back into the empty wafer cassette 10, the cassette stocker 5 is moved horizontally. The horizontal movement of the cassette stocker 5 places the next unprocessed wafer cassette 10 in the row face-to-face with the wafer handling head 15 so that the unprocessed wafers 9 can be transferred to the boat 6.

While the unprocessed wafers 9 of the cassette stocker 5 are being transferred, the wafer cassette 10 loaded with the processed wafers 9 (hereinafter, the wafer cassette 10 loaded with the processed wafers 9 is referred to as "processed wafer cassette 10") is removed by the wafer cassette receiving system 22.

Once the processed wafer cassette 10 has been removed, the cassette stocker 5 has a space available for an unprocessed wafer cassette.

The wafer cassette receiving system 22 then moves an unprocessed wafer cassette 10 from the buffer cassette stocker 21 to the available location in the cassette stocker 5. Further, the wafer cassette receiving system 22 retrieves an unprocessed wafer cassette 10 from the outside and sequentially moves it to the empty location in the buffer cassette stocker 21, which has been made available by the above transfer operation.

As the processing of the wafers 9 proceeds, the unprocessed wafer cassette 10 is moved from the outside into the buffer cassette stocker 21, and the processed wafer cassette 10 is moved from the cassette stocker 5 to the outside. The unprocessed wafer cassette 10 is then transferred from the buffer cassette stocker 21 to the cassette stocker 5. Thus, unprocessed wafer cassettes 10 are continuously brought in, and processed wafer cassettes 10 are continuously brought out. The resulting wafer processing efficiency is extensively improved.

As described above, it is possible, according to the present invention, to reduce wafer processing delays caused by transporting wafer cassettes 10 to and from the vertical CVD apparatus by providing the buffer cassette stocker 21. The second embodiment described below depicts how the present invention effectively prevents the natural oxidation of the wafers 9 in standby status in the vertical CVD apparatus.

Figure 4:
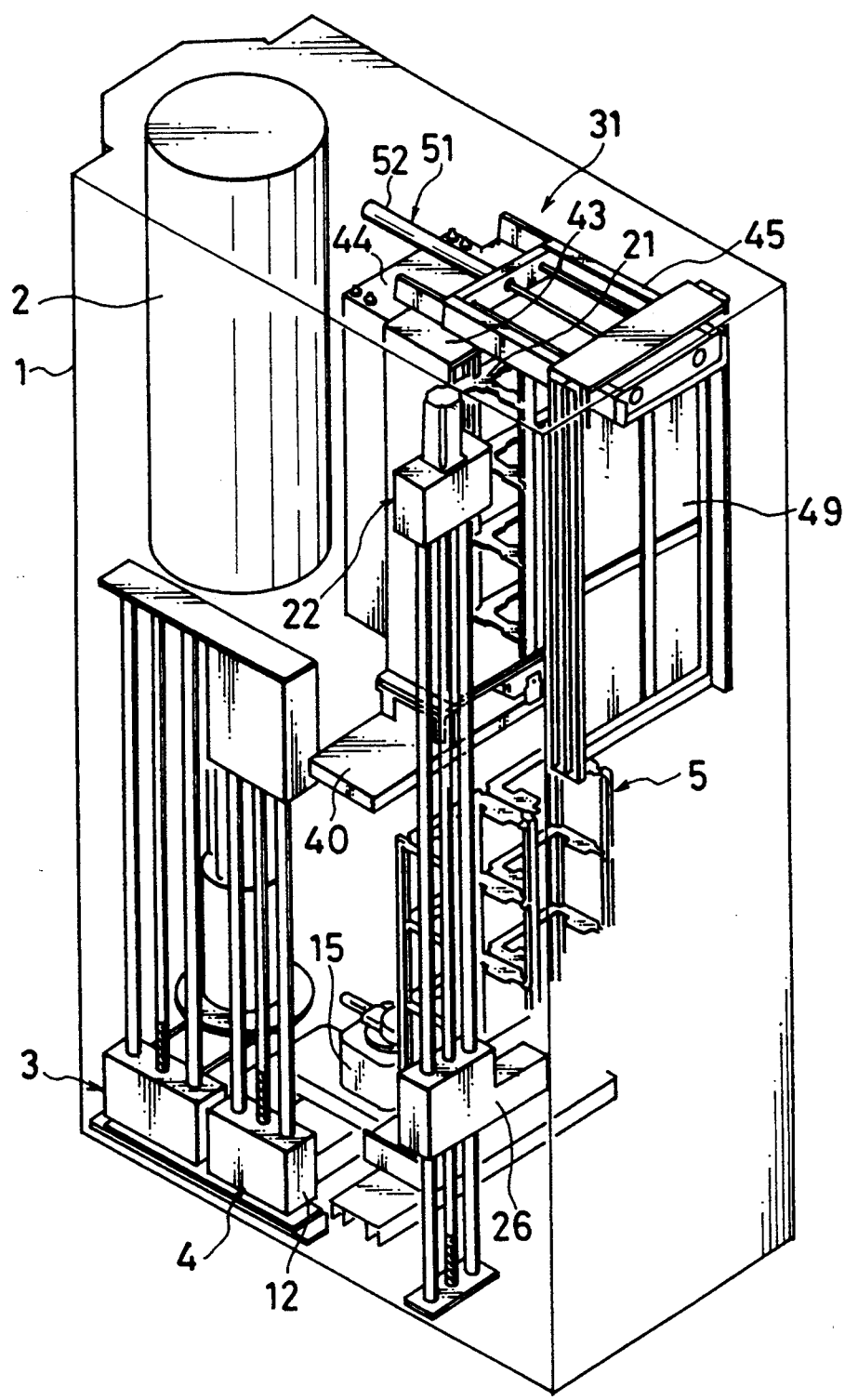
FIG. 4 is a perspective view of a second embodiment of the present invention.
Figure 5:
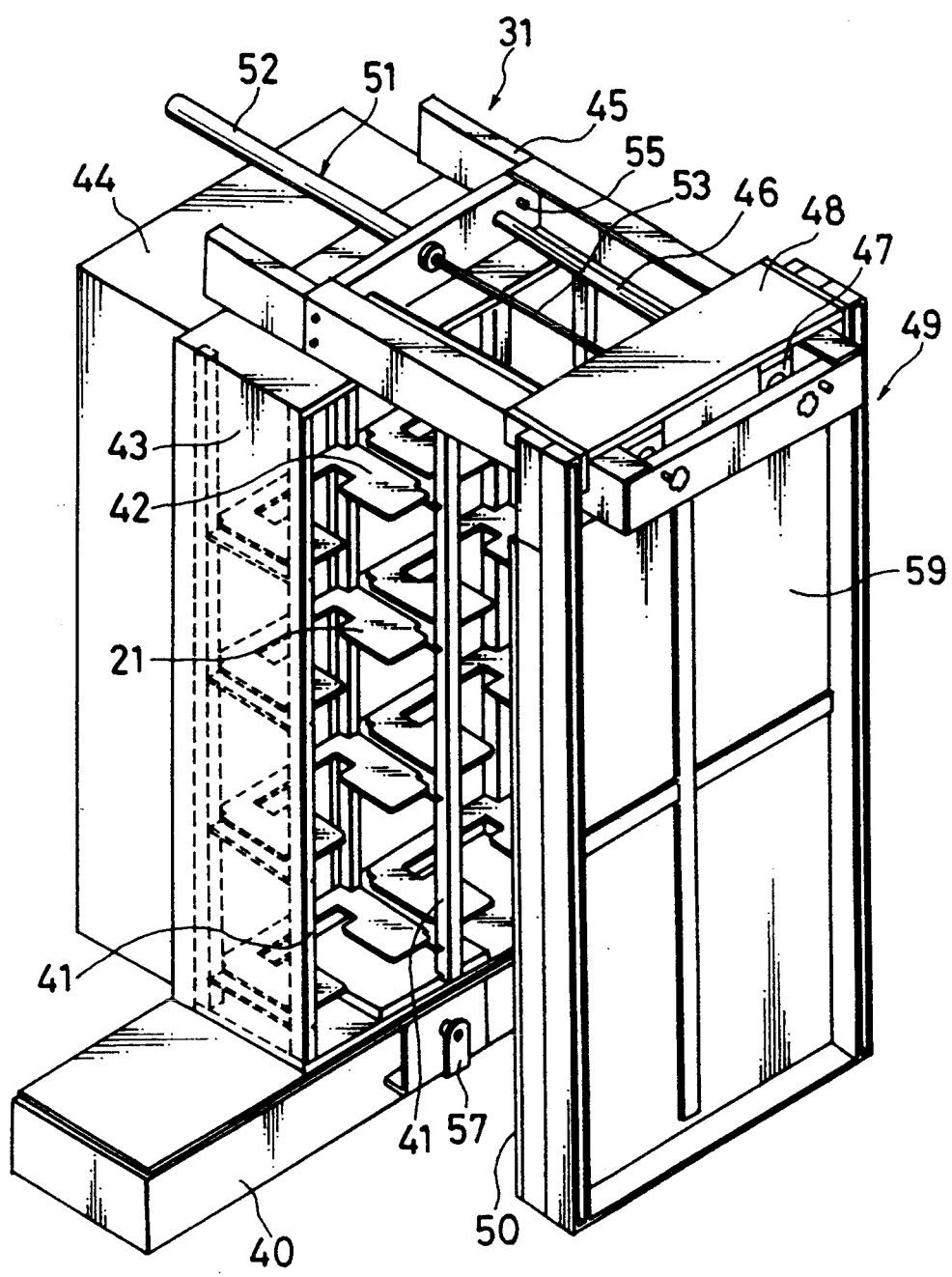
FIG. 5 is a perspective view of a buffer cassette enclosure in the second embodiment of the present invention.
Figure 6:
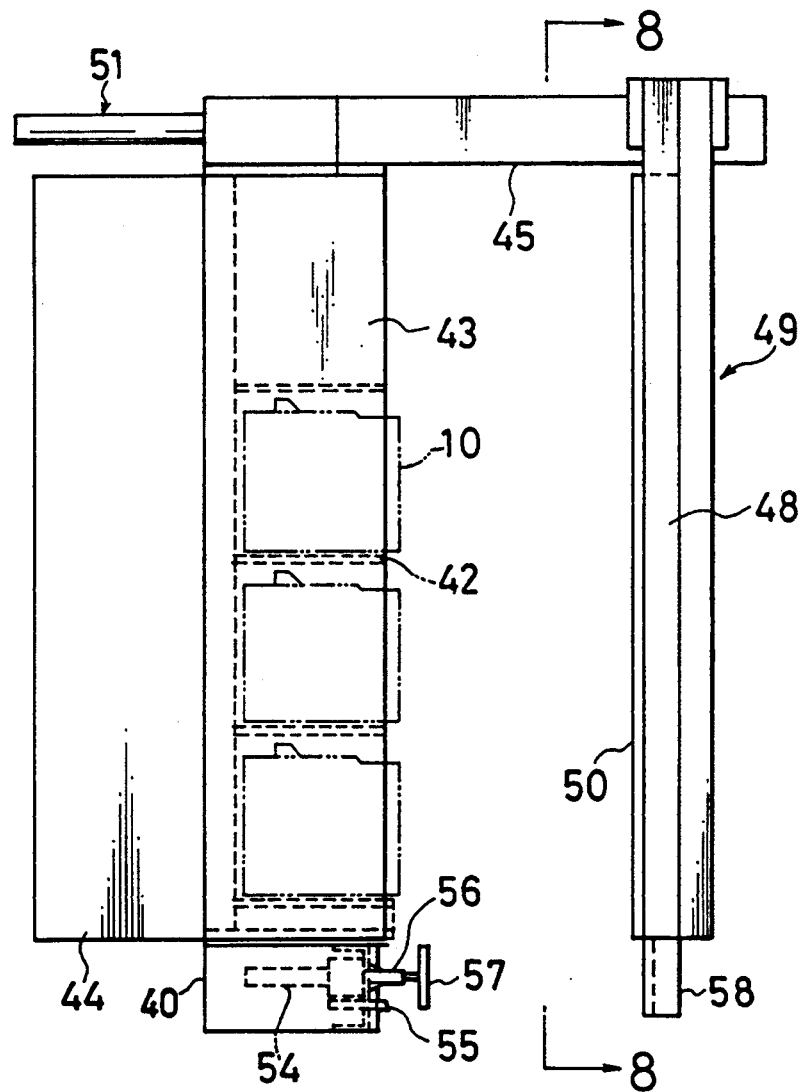
FIG. 6 is a side view of the buffer cassette enclosure.
Figure 7:
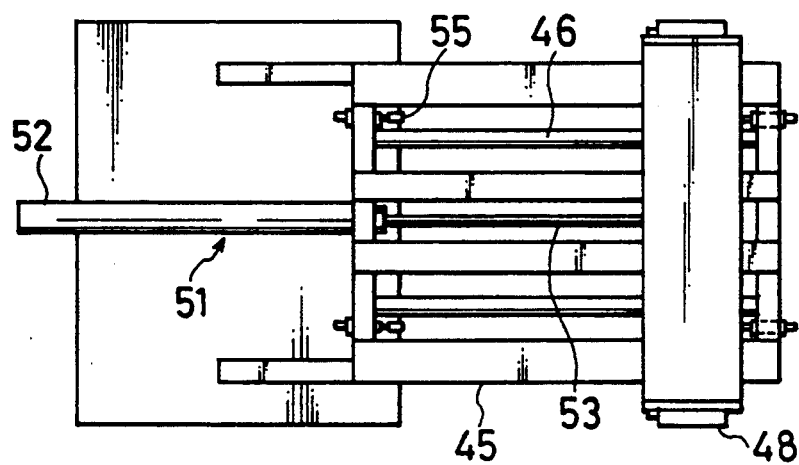
FIG. 7 is a plan view of the buffer cassette enclosure.
Figure 8:
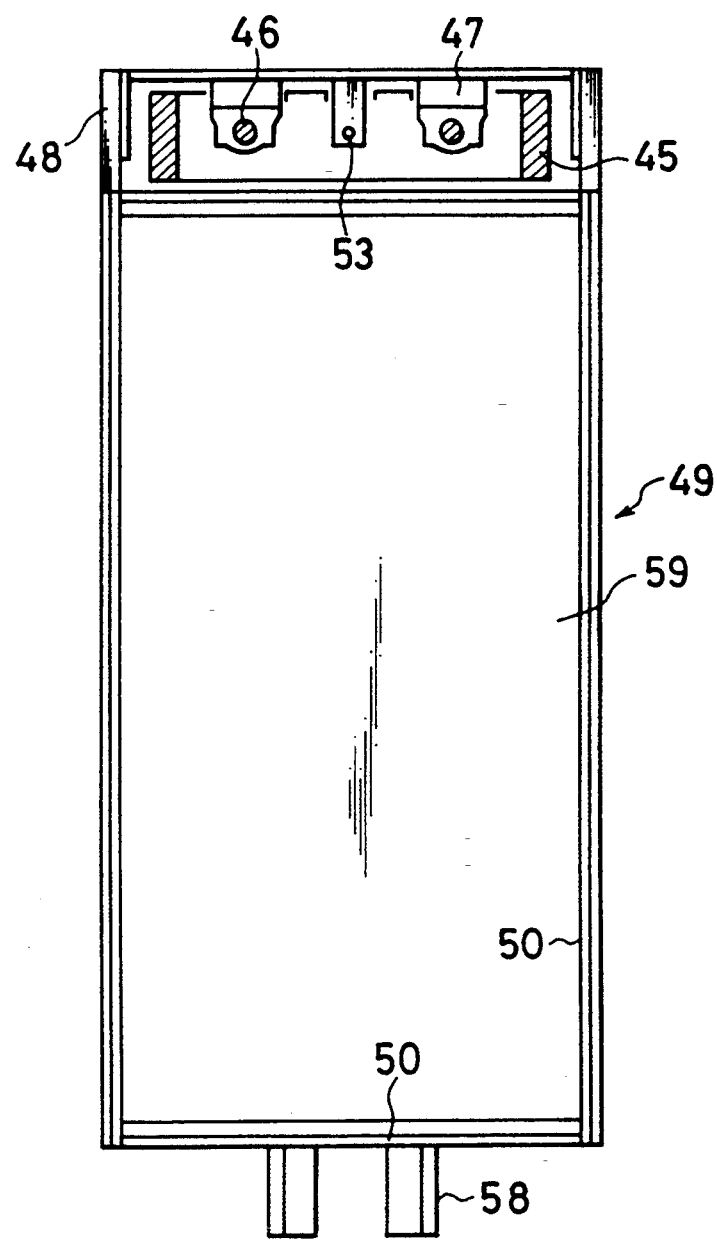
FIG. 8 is an arrow diagram along the line 8—8 of FIG. 6.
Figure 9:
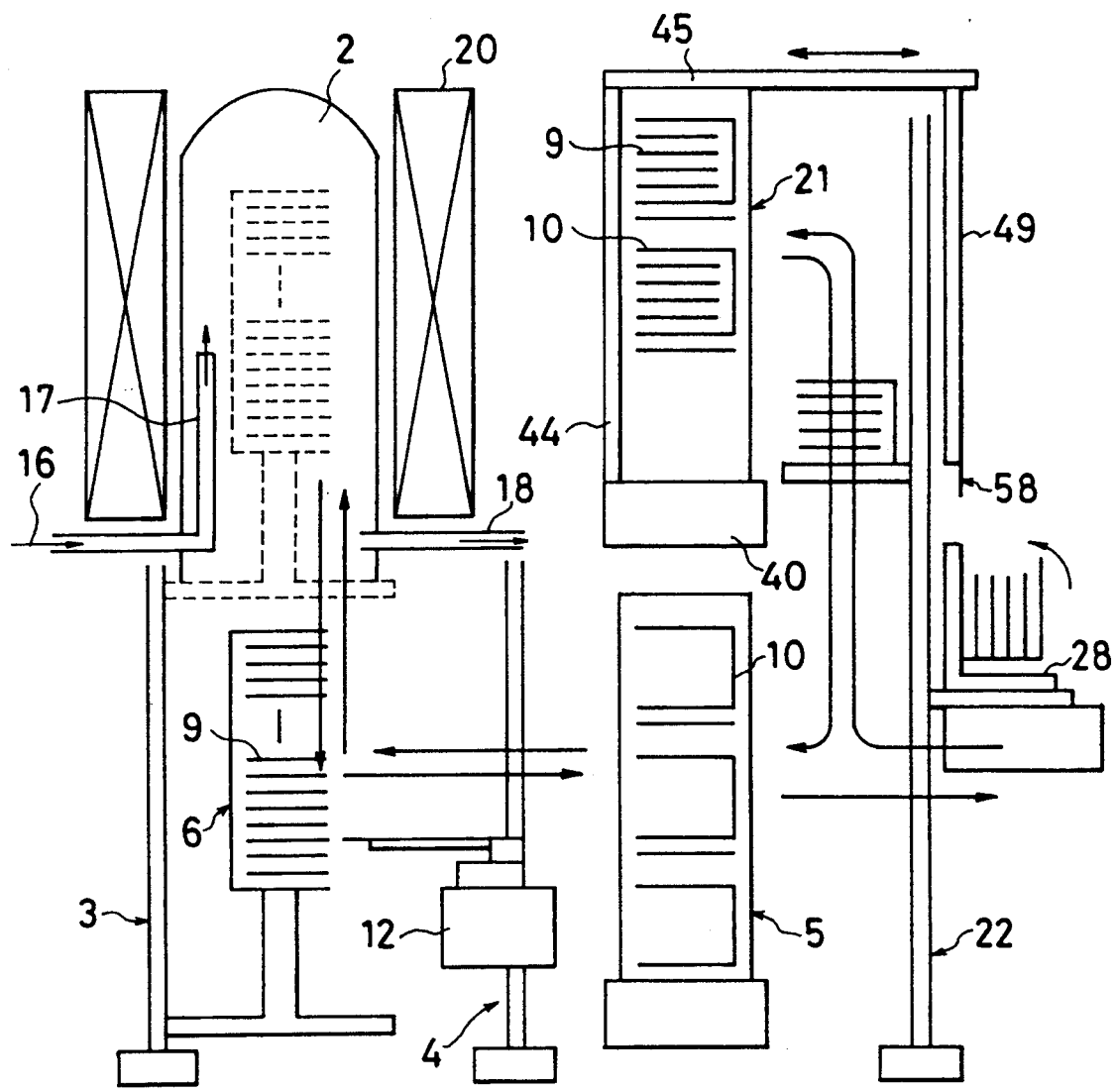
FIG. 9 is a drawing describing the operation of the second embodiment of the present invention.

The following describes the second embodiment with reference to FIG. 4.

The second embodiment has an arrangement similar to that of the first embodiment except that there is provided a buffer cassette stocker enclosure 31 which encompasses the buffer cassette stocker 21 and forms a closed antioxidation area. The buffer cassette stocker enclosure 31 can be opened and closed so that wafer cassettes can be brought in or out.

In FIG. 4, cubicle 1, reaction furnace 2, boat elevator 3, wafer transfer system 4, cassette stocker 5, wafer handling head 15, wafer cassette receiving system 22, etc. are the same as in the above embodiment, therefore a detailed description is not provided. The following describes the buffer cassette stocker enclosure 31 and the buffer cassette stocker 21, referring to FIGS. 5-9.

The buffer cassette stocker 21 comprises a plurality of support pillars 41 mounted on a frame 40, and shelf boards 42 arranged in the desired shelves between the support pillars 41. A cover 43 is provided to cover both the sides and the top of the buffer cassette stocker 21. On the back of the buffer cassette stocker 21, a clean unit 44 is arranged. The clean unit 44 supplies clean air, supplies and discharges antioxidant gas to and from the buffer cassette stocker 21, and provides an antioxidant gas supplying means and a gas discharging means (not shown).

The front surface of the box comprising the frame 40, the cover 43 and the clean unit 44 is totally covered by a lid 49, which can be opened and closed. Thus, an enclosure surrounding the buffer cassette stocker 21 is formed by the frame 40, the cover 43, the clean unit 44 and the lid 49. Antioxidant gas is supplied into this area through the clean unit 44 to create an antioxidation area.

A rectangular support frame 45 which protrudes forward is mounted on the top surface of the cover 43. Two guide rods 46 are mounted between the front member and the back member of the support frame 45, and the lid 49 is slidably engaged with the two guide rods 46. The front opening of the antioxidation area can be closed or opened by the lid 49.

The lid 49 comprises a slide block 47 slidably engaged with the guide rods 46 respectively, a rectangular hanging frame 48 suspended on the slide block 47, and a cover plate 59 attached on the hanging frame 48.

On the portion where the margin of the lid 49 comes into contact with the margin of the cover 43, sealing means 50 such as silicone tubing is attached.

An opening cylinder 51 is arranged parallel to the guide rod 46 between the two slide blocks 47. A cylinder tube 52 of the opening cylinder 51 is fixed on the support frame 45. By connecting a cylinder rod 53 with the hanging frame 48 and by expanding and contracting the opening cylinder 51, the lid 49 can be opened or closed with respect to the cover 43.

A buffer 55 is provided at the point where the support frame 45 is brought into contact with the hanging frame 48.

A swing cylinder 54 is mounted on the frame 40. The rod 56 of the swing cylinder 54 rotates as it moves back and forth, and a lock plate 57 is fixed on the tip of the rod 56.

A hook seat 58 is provided on a lower horizontal portion of the hanging frame 48 at a position facing the lock plate 57 so that the hook seat 58 and the lock plate 57 can engage each other.

An oxygen concentration detecting means (not shown) is provided at a convenient location in the antioxidation area within the cover 43. The flow rate of the antioxidant gas supplied to the antioxidation area is controlled by antioxidant gas flow rate controlling means (not shown) according to the oxygen concentration detected by the oxygen concentration detecting means.

The following provides a description of the operation of the second embodiment.

FIGS. 4-8 show the lid 49 in an open condition.

By expanding the opening cylinder 51, the lid 49 is separated from the cover 43 as shown in the figures, and the antioxidation area is opened.

Unprocessed wafer cassettes 10 may be moved into the cassette stocker 5 and the buffer cassette stocker 21 by the wafer cassette receiving system 22.

Once the unprocessed wafer cassettes 10 have been situated in the buffer cassette stocker 21, the opening cylinder 51 is contracted to pull the slide block 47. By moving the slide block 47, the lid 49 is moved from an open condition to a closed condition.

When the lid 49 closes against the opening of the antioxidation area which is formed by the frame 40, the cover 43 and the clean unit 44, the lid 49 first strikes against the buffer 55 on the support frame 45. The buffering action alleviates the shock to the hanging frame 48 and the lid 49 when the lid 49 strikes against the cover 43.

When the lid 49 closes, the swinging cylinder 54 is operated and the rod 56 is rotated. The lock plate 57 at the tip of the rod 56 engages the hook seat 58 and the lid 49 locks closed as it is pressed against the cover 43. As a result, the sealing means 50 is deformed, and the antioxidation area is tightly closed.

Next, antioxidant gas supplied by the antioxidant gas supplying means in the clean unit 44 is provided into the closed antioxidation area, and the atmospheric air containing oxygen is discharged by the gas discharging means of the clean unit 44. Thus, the air in the antioxidation area is replaced by antioxidant gas.

The oxygen concentration in the antioxidation area is detected by the oxygen concentration detecting means. The flow rate of the antioxidant gas is controlled by the antioxidant gas flow rate controlling means according to the detected oxygen concentration.

Next, once an unprocessed wafer cassette has been situated in the cassette stocker 5, the wafers 9 in the unprocessed wafer cassette 10 are transferred to the boat 6 by the wafer transfer system 4, and the boat 6 is placed into the reaction furnace 2 by the boat elevator 3.

When film formation has been completed, the boat 6 is pulled out by the boat elevator 3, and the wafer transfer system 4 transfers the wafers 9 to the empty wafer cassette 10 situated in the cassette stocker 5. The processed wafer cassette 10 loaded with the processed wafers 9 is removed from the vertical CVD apparatus by the wafer cassette receiving system 22 and is sent to subsequent processes.

When the processed wafer cassette 10 is removed from the cassette stocker 5, an unprocessed wafer cassette 10 may be transferred from the buffer cassette stocker 21 to the available space in the cassette stocker 5.

The supply of the antioxidant gas from the antioxidant gas supply means and the discharge of the gas from the gas discharging means are then stopped. The lock plate 57 is separated from the hook seat 58 by the rotation of the swinging cylinder 54. The opening cylinder 51 is expanded and the lid 49 is opened. The buffer 55 reduces the shock when the lid 49 is opened.

The unprocessed wafer cassette 10 is transferred from the buffer cassette stocker 21 to the emptied cassette stocker 5 by the wafer cassette receiving system 22. The same procedure is repeated thereafter.

The buffer cassette stocker 21 can bring the unprocessed wafer cassette 10 from outside the vertical CVD apparatus even while film is being formed in the vertical CVD apparatus. This eliminates or extensively reduces the waiting time of unprocessed wafer cassettes 10 outside of the apparatus. Further, the wafers in standby status in the buffer cassette stocker 21 are protected from oxygen contained in the atmospheric air, and, as a result, natural oxidation film is prevented from forming on the wafers.

Figure 10:
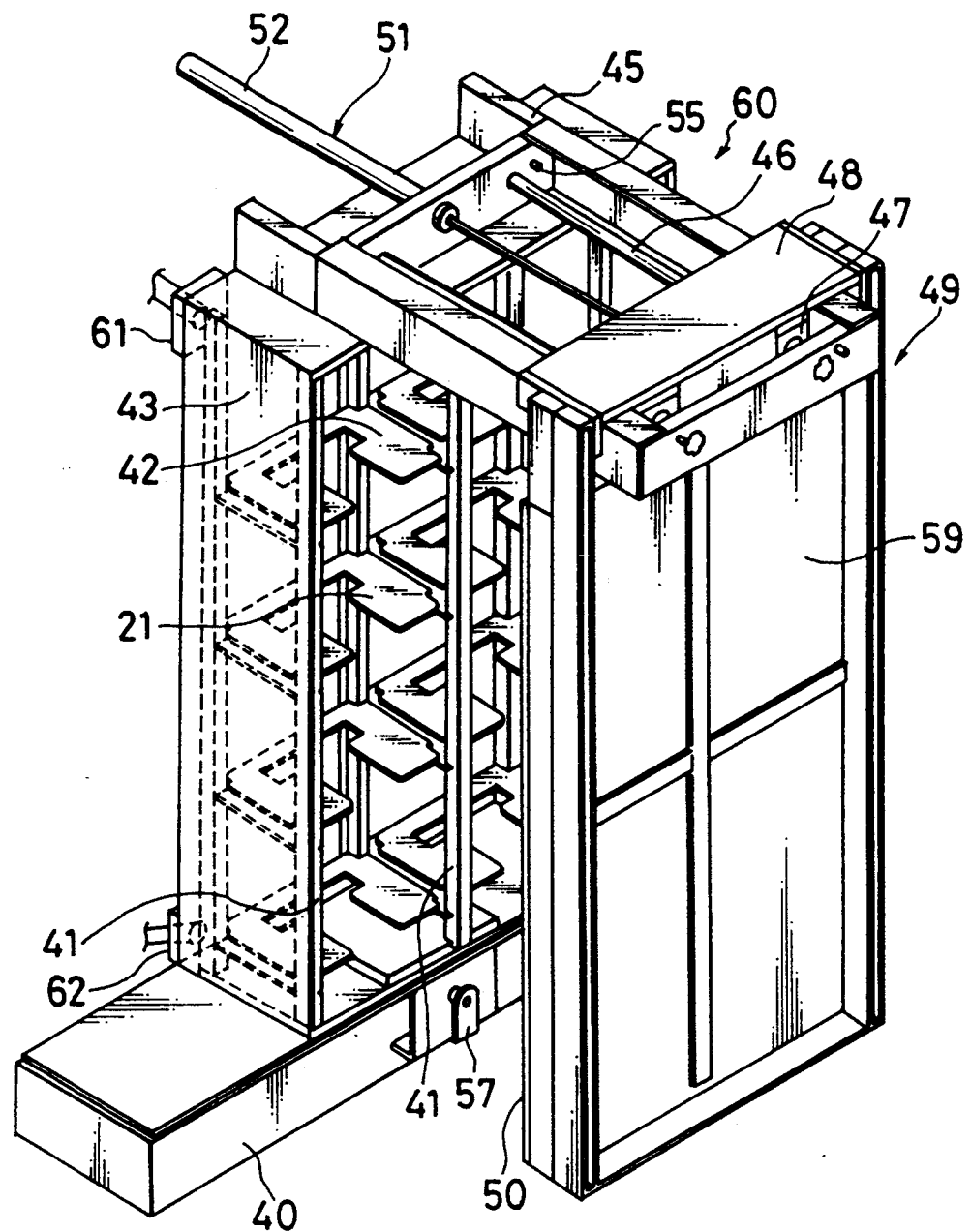
FIG. 10 is a perspective view of a second embodiment of the buffer cassette enclosure.

FIG. 10 represents another example of a buffer cassette stocker enclosure 60.

In this buffer cassette stocker enclosure 60, the back of the buffer cassette stocker 21 is covered by a cover 43 without the clean unit 44 as provided in the buffer cassette stocker enclosure 31 of the embodiment in FIGS. 4–9. Antioxidant gas supplying means 61 is provided at the upper portion of the back of the cover 43, and a gas discharging means 62 is provided at the lower portion of the back of the cover 43.

In this buffer cassette stocker enclosure 60, a closed antioxidation area is formed by the cover 43 and the lid 49. Antioxidant gas is supplied by the antioxidant gas supplying means 61. By replacing the air in the antioxidation area with the antioxidant gas, the natural oxidation of the wafers 9 in the buffer cassette stocker 21 can be prevented.

The opening and closing mechanism of the buffer cassette stocker 21 and the lid 49 is the same as described in FIGS. 5–8. The same components are referred to by the same numerical references, therefore, the detailed description is not repeated.

Figure 11:
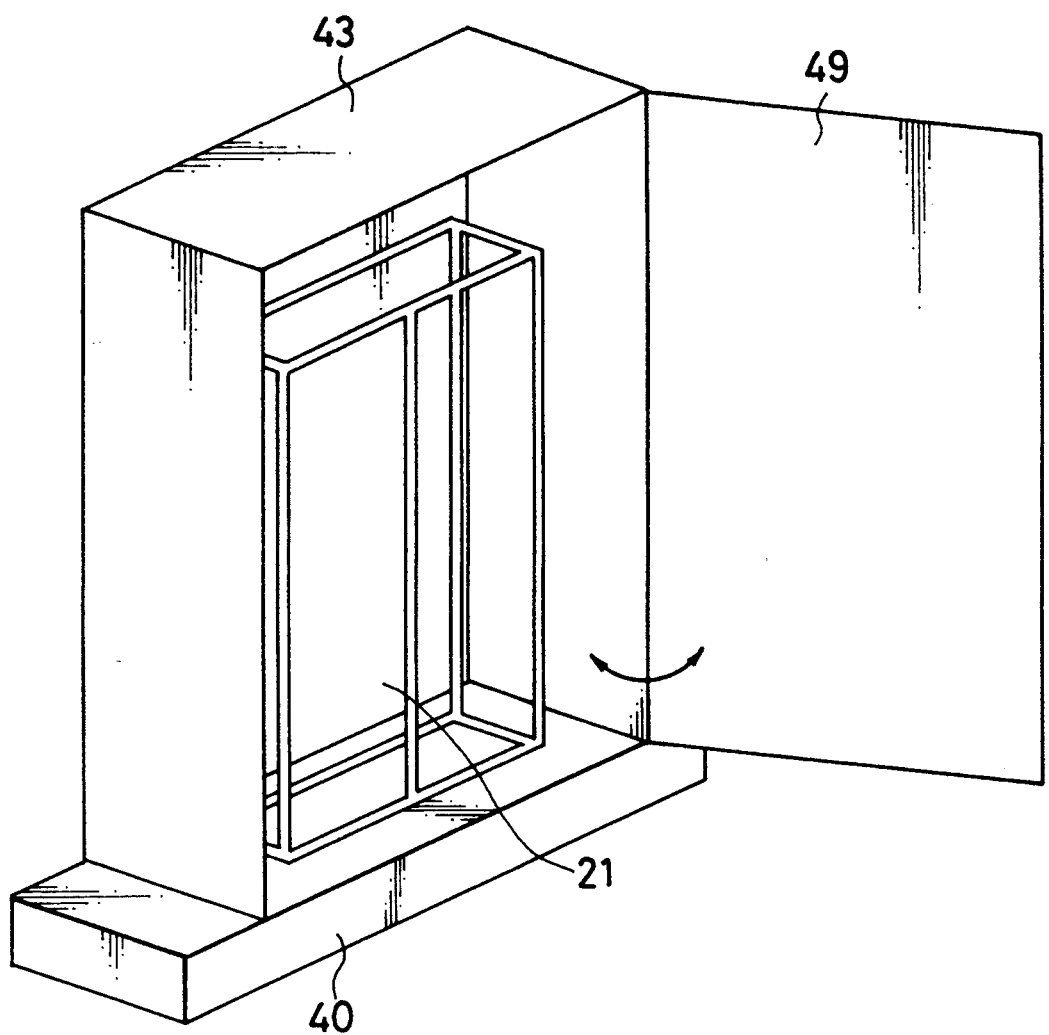
FIG. 11 is a perspective view of a third embodiment of the buffer cassette enclosure.
Figure 12:
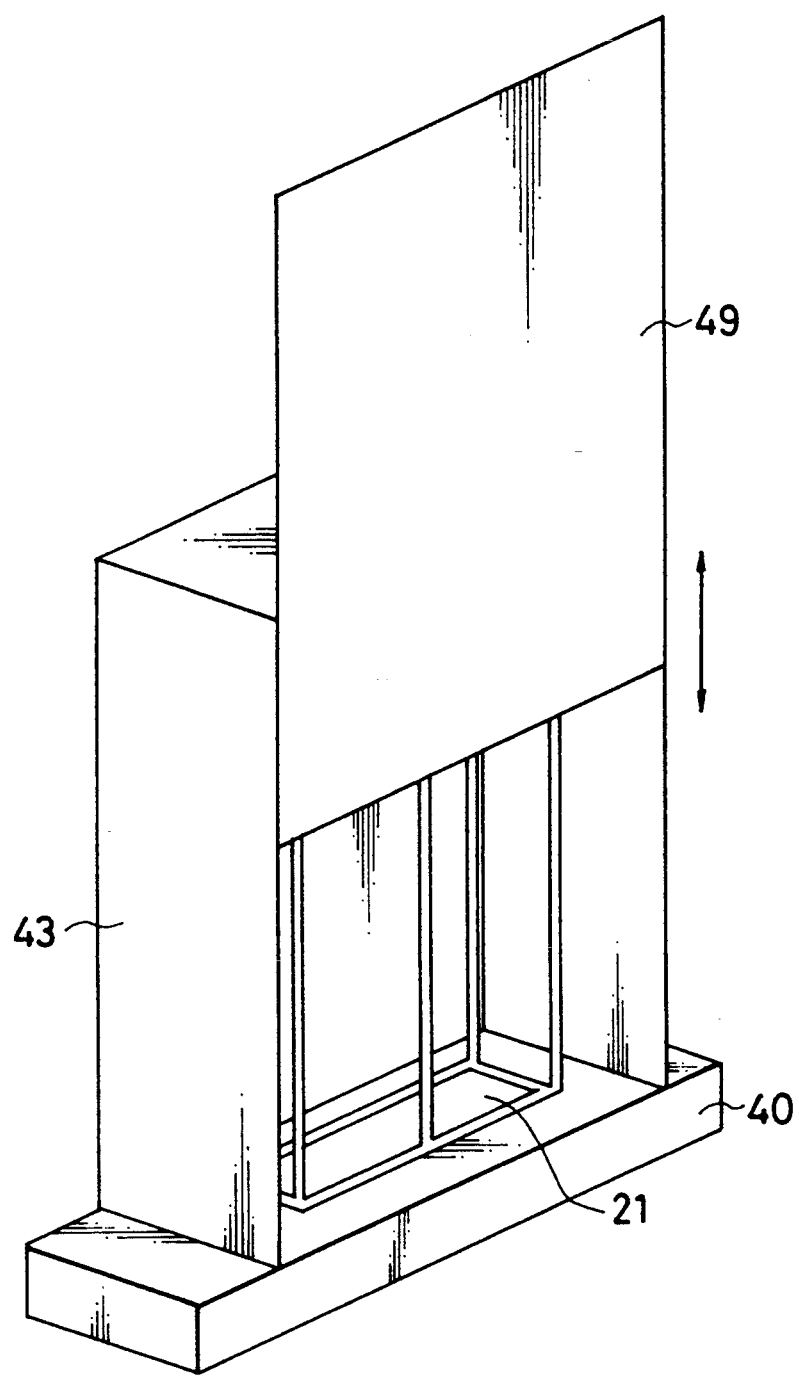
FIG. 12 is a perspective view of a fourth embodiment of the buffer cassette enclosure.
Figure 13:
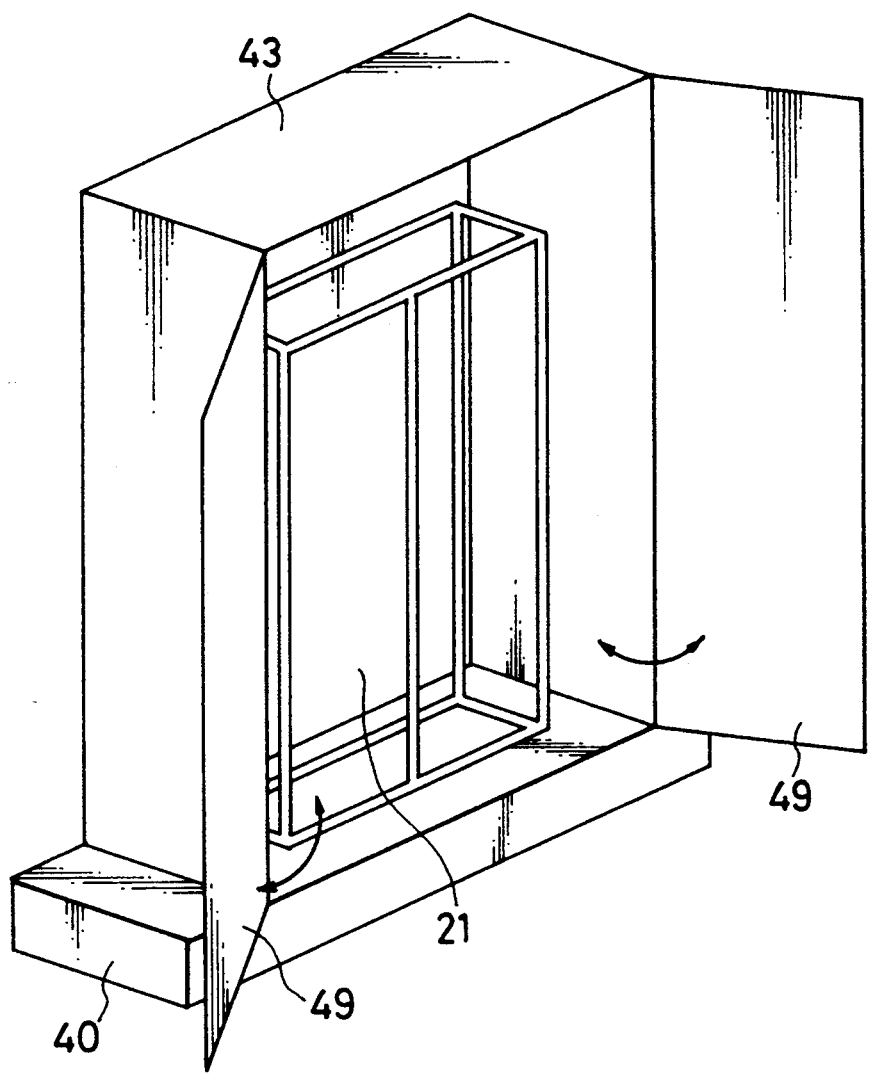
FIG. 13 is a perspective view of a fifth embodiment of the buffer cassette enclosure.

The above two embodiments are designed in a horizontally sliding system in which the lid 49 is opened and closed while maintaining a position vertical to the buffer cassette stocker 21. However, the lid 49 may be designed to rotate around one of its sides as shown in FIG. 11, or it may be designed to slide vertically with respect to the buffer cassette stocker 21 as shown in FIG. 12, or the lid 49 may be divided into two parts and the divided parts may be designed to rotate separately as shown in FIG. 13. Further, antioxidant gas is used for the prevention of natural oxidation in each of the above embodiments. Inert gas may be used for this purpose as well.

As described above, according to the present invention, it is possible to efficiently transfer unprocessed wafer cassettes and processed wafer cassettes. Furthermore, it is possible to prevent the natural oxidation of the wafers in standby status from exposure to oxygen in the atmospheric air and to avoid generating natural oxidation film. Thus, the invention contributes to the improvement of product quality and yield in the manufacture of semiconductor elements.

What is claimed is:

1. A semiconductor manufacturing apparatus, comprising a cassette stocker for accommodating wafer cassettes loaded with wafers, a reaction furnace provided with heating means, a reaction gas introducing means for introducing reaction gas into the reaction furnace, a gas discharging means for discharging exhaust gas from the reaction furnace, a boat which is located above the cassette stocker for supporting wafers, a buffer cassette stocker for storing unprocessed wafers, a boat elevating means for placing the boat into and pulling the boat from the furnace, a wafer transfer means for transferring the wafers between the boat and the wafer cassettes in the cassette stocker, wherein the wafer transfer means includes a lifting base which moves up and down to service the cassette stocker and the buffer cassette stocker, a cassette receiver mounted on said lifting base through a link mechanism, rotatable around a horizontal rotating shaft by 90°, and movable back and forth by said link mechanism with respect to the buffer cassette stocker and the cassette stocker, and a wafer cassette transfer means for transferring wafer cassettes between the buffer cassette stocker and the cassette stocker.

2. A semiconductor manufacturing apparatus according to claim 1, wherein there is provided antioxidation means enclosing the buffer cassette stocker, which comprises a lid freely opened and closed, and which forms an antioxidation area when the lid is closed and the buffer cassette stocker is shut off from the atmospheric air.

3. A semiconductor manufacturing apparatus according to claim 2, wherein antioxidation means contains one or more buffer cassette stockers.

4. A semiconductor manufacturing apparatus according to claim 2, wherein there are provided antioxidant gas supplying means and gas discharging means in the antioxidation area.

5. A semiconductor manufacturing apparatus according to claim 2, wherein oxygen concentration detecting means is provided in the antioxidation area.

6. A semiconductor manufacturing apparatus according to claim 5, wherein a controlling means is provided for determining flow rate of the antioxidant gas according to the result detected by the oxygen concentration detecting means.

7. A semiconductor manufacturing apparatus according to claims 2 or 5, wherein the antioxidant gas is supplied to the antioxidation area by means of a clean unit.

8. A semiconductor manufacturing apparatus according to claim 2, wherein the antioxidant means comprises a lid for opening and closing the antioxidation area, a frame for mounting the buffer cassette stocker, and a cover for covering the buffer cassette stocker.

9. A semiconductor manufacturing apparatus according to claim 7, wherein at least a part of the cover for covering the buffer cassette stocker consists of the clean unit.

10. A semiconductor manufacturing apparatus according to claim 8, wherein the antioxidation area is opened and closed by moving the lid horizontally.

11. A semiconductor manufacturing apparatus according to claim 8, wherein the antioxidation area is opened or closed by rotating the lid around one of the sides thereof.

12. A semiconductor manufacturing apparatus according to claim 8, wherein the antioxidation area is opened or closed by moving the lid vertically.

13. A semiconductor manufacturing apparatus according to claim 8, wherein the antioxidation area is opened or closed by rotating each of divided parts of the lid around one of the sides of each divided part of the lid.

14. A semiconductor manufacturing apparatus according to claim 1, wherein there is provided a cassette stocker or a buffer cassette stocker, each of which is furnished with one or more shelves aligned in one or more rows, where wafer cassettes can be loaded.

* * * * *

UNITED STATES PATENT AND TRADEMARK OFFICE
CERTIFICATE OF CORRECTION

PATENT NO.   : 5,387,265
DATED        : February 7, 1995
INVENTOR(S)  : Satoshi Kakizaki, et al It is certified that error appears in the above-identified patent and that said Letters Patent is hereby corrected as shown below:

On the title page, item [75] Inventors:
after "Mikio Koizumi" please insert --Eiji Hosaka, Seiji Watanabe, Shigeo Fukuda, Hideki Koike--.

This certificate supersedes Certificate of Correction issued May 2, 1995.

Signed and Sealed this

Sixteenth Day of April, 1996

BRUCE LEHMAN

*Attest:*

*Attesting Officer*                    Commissioner of Patents and Trademarks